United States Patent
Freidhof et al.

(10) Patent No.: US 10,845,400 B2
(45) Date of Patent: Nov. 24, 2020

(54) MEASUREMENT APPARATUS AND MEASUREMENT METHOD

(71) Applicant: Rohde & Schwarz GmbH & Co. KG, Munich (DE)

(72) Inventors: Markus Freidhof, Kirchseeon (DE); Andreas Maier, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 273 days.

(21) Appl. No.: 16/040,662

(22) Filed: Jul. 20, 2018

(65) Prior Publication Data
US 2020/0025812 A1     Jan. 23, 2020

(51) Int. Cl.
*G01R 23/167*      (2006.01)
*G01R 13/02*       (2006.01)

(52) U.S. Cl.
CPC .......... *G01R 23/167* (2013.01); *G01R 13/02* (2013.01)

(58) Field of Classification Search
CPC .. G01R 23/167; G01R 13/02; G01R 19/2509; G01R 13/0272; G01R 23/163
See application file for complete search history.

(56) References Cited

U.S. PATENT DOCUMENTS

| | | | |
|---|---|---|---|
| 4,271,486 A | 6/1981 | Dagostino et al. | |
| 4,656,598 A | 4/1987 | Wilson | |
| 9,188,611 B2 | 11/2015 | Guo et al. | |
| 2002/0163346 A1* | 11/2002 | Arndt | G01V 3/104 324/639 |
| 2013/0154878 A1* | 6/2013 | Guo | G01R 19/2513 342/357.25 |
| 2017/0124736 A1* | 5/2017 | Bresser | G06T 11/206 |

* cited by examiner

*Primary Examiner* — Farhana A Hoque
(74) *Attorney, Agent, or Firm* — Westman, Champlin & Koehler, P.A.

(57) ABSTRACT

The present invention relates to a processing of digitally measured signals. When sampling a measurement signal with a predetermined sampling rate, aliasing effects may occur, if a Nyquist condition is violated. For this purpose, the present invention suggests to analyze a frequency spectrum of a signal and to compare the frequency components of the spectrum with the setting of a measurement apparatus, in particular a sampling rate of the measurement apparatus. If a measurement signal comprises frequency components which may violate the Nyquist condition, an alert may be generated to adapt the set of the measurement arrangement.

18 Claims, 2 Drawing Sheets

MEASUREMENT APPARATUS AND MEASUREMENT METHOD

TECHNICAL FIELD

The present invention relates to a measurement apparatus. The present invention further relates to a measurement method. In particular, the present invention relates to digitally measuring a signal.

BACKGROUND

Although applicable in principle to any measurement arrangement for measuring digital signals, the present invention and its underlying problem will be hereinafter described in combination with a digital oscilloscope.

In modern days electronic devices are used in a growing number of applications. Many electronical devices deal with signals of relative high frequencies. During development or production of electronic devices, it is necessary to thoroughly test these devices. For this purpose, high frequency signals have to be measured and analyzed. For example, an oscilloscope may be used for measuring a high frequency signal and displaying a signal curve relating to the measured signal.

For digitally measuring a signal, the signal has to be sampled with a predetermined sampling rate. If the sampling rate is not high enough, distortions or artefacts may occur in a signal reconstructed from the samples of the digitally measured signal.

Thus, a problem addressed by the present invention is how to determine whether the sampling rate of a measurement system is appropriate for a measured signal. Furthermore, there is a need for identifying an inappropriate setting of a measurement device when digitally measuring a signal.

SUMMARY

The present invention therefore provides a measurement apparatus and a measuring method with the features of the independent claims. Further embodiments are subject of the dependent claims.

According to a first aspect, a measurement apparatus for digitally measuring a signal is provided. The apparatus comprises an input device, a spectrum analyzing device, a signal processing device and a control processor. The input device is adapted to receive a measurement signal. The spectrum analyzing device is adapted to determine a frequency spectrum of the received measurement signal. The signal processing device is adapted to process the received measurement signal. In particular, the signal processing device may process the received measurement signal with a preset sampling rate. The control processor is adapted to set the sampling rate of the processing device. The control processor is further adapted to determine a position of at least one frequency component of the frequency spectrum relative to a Nyquist frequency of the signal processing device.

According to a second aspect, a measurement method for digitally measuring a signal is provided. The measurement method comprises a step of receiving a measurement signal. The measurement signal may be received by an input device. The method further comprises a step for determining a frequency spectrum of the received measurement signal. The determining of the frequency spectrum may be performed by a spectrum analyzing device. Further, the method comprises a step of processing the received measurement signal with a preset sampling rate. The processing may be performed by a signal processing device. Finally, the method comprises a step of setting the sampling rate of the signal processing device, and a step of determining a position of at least one frequency component of the frequency spectrum relative to a Nyquist frequency, in particular a Nyquist frequency of the signal processing device. The steps of setting the sampling rate and the determining step may be performed by a control processor.

The present invention is based on the fact that a sampling rate for digitizing a measurement signal has to consider the highest frequencies in the measurement signal. Otherwise, if the sampling rate is too low, distortions or artefacts may exist when reproducing the digitized signal. Such effects are known, for example as an aliasing.

The present invention aims to take into account this fact and provides an analysis of the settings for measuring a digital signal. In particular, the present invention aims to identify inappropriate settings when dealing with frequency signals, in particular high frequency signals which are sampled with a predetermined sampling rate. Accordingly, by identifying inappropriate settings, the settings may be adapted to overcome aliasing effects or the like. For example, an automated modification of the settings may be applied. Alternatively, a user may be informed that the present settings may cause disturbances, in particular aliasing effects. Thus, the user may adapt the settings accordingly in order to achieve an appropriate measurement.

The input device may be any kind of device for receiving a measurement signal from an external signal source. The received measurement signal may be an analog signal or a digital signal. In case the received measurement signal is a digital signal, the digital measurement signal may be sampled with a predetermined input sampling rate. In case the received measurement signal is an analog signal, the analog measurement signal may be converted to a digital signal with a predetermined input sampling rate. Furthermore, it may be also possible that the received analog input signal may be provided by the input device as an analog signal, and the analog signal may be converted to a digital signal at a later stage of the measurement procedure. For example, the analog-to-digital conversion may be also performed by the signal processing device.

The measurement signal may be received by the input device at an input terminal. The input terminal may comprise, for instance, a connector for connecting a signal source. The signal source may be any kind of source for providing a measurement signal. For example, the signal source may be a device under test which provides a number of one or more measurement signals. However, it is understood that any other kind of measurement signal may be also received by the input device.

The input device may comprise further elements such as amplifier, attenuator, filter elements or the like. In case, an analog signal is received, the input device may comprise an analog-to-digital converter. However, the input device is not limited to the above-mentioned examples. Furthermore, any further kind of elements may be also provided in the input device.

The spectrum analyzing device may be any kind of device for analyzing the signal provided by the input device based on the received measurement signal in order to determine a frequency spectrum of the signal. For example, the spectrum analyzing device may identify each frequency component which is comprised in the respective signal. Alternatively, it may be also possible that the spectrum analyzing device analyses a number of multiple frequency bands, and provides a single output signal for each of the number of frequency bands. Accordingly, all frequencies in such frequency band are considered together as a single frequency component.

The analyzing of the spectrum analyzing device for determining the frequency spectrum may be performed by any appropriate manner. For example, the spectrum analyzing device may perform a Fast Fourier Transform (FFT) for identifying the frequency components of the spectrum. It may be also possible that a spectrum analyzing device comprises multiple filter elements, each filter element relating to a predetermined frequency or frequency band in order to identify frequencies according to the setting of the respective filter element. It is understood, that any other method for identifying the frequency spectrum in the signal may be also possible.

In a possible implementation manner, the spectrum analyzing device may be implemented, for example by a Field Programmable Gate Array (FPGA) or another Application-specific Integrated Circuit (ASIC).

In a possible implementation manner, the determination of the frequency components is not performed in real-time, i.e. a sequence of the signal is analyzed offline. In this case, the processing of the received signal for determining the frequency components may be performed with a low processing speed. Thus, the determination of the frequency spectrum can be performed with a simple and cheap hardware.

The signal processing device may be any kind of device for processing the measurement signal, in particular the signal provided by the input device. In particular, the processing of the signal processing device may be performed with a preset sampling rate. In case the signal provided by the input device is an analog signal, the signal processing device may comprise an analog-to-digital converter for digitizing the analog signal with the preset sampling rate. Alternatively, if the signal provided by the input device is a digital signal, the signal processing device may adapt, in particular decrease the sampling rate of the provided digital signal to the preset sampling rate. Hence, a digital signal with a sampling rate higher than a preset sampling rate may be received and the sampling rate may be decreased by the signal processing device. Furthermore, the signal processing device may perform any further kind of operation of the measurement signal, in particular the signal provided by the input device. For example, the signal processing device may apply an additional filtering to limit the frequency range of the signal or to equalize the signal. Furthermore, amplification, attenuation or any other operation of the signal may be applied by the signal processing device. In particular, the signal processing device may apply any kind of operation for analyzing, recording or displaying the respective signal. It is understood, that the operations of the signal processing device are not limited to the above-mentioned operations. Furthermore, any other kind of operation may be also applied to the signal by the signal processing device.

The control processor may be adapted to control the operations of the signal processing device at least in part. For example, the control processor may control the sampling rate of the signal processor and set the sampling rate of the signal processor accordingly. For this purpose, the control processor may be communicatively coupled with the signal processing device. For example, the control processor may be coupled with the signal processing device by a local network or a communication bus. Furthermore, it may be also possible that the control processor and the signal processing device may be implemented in a common processing device.

The spectrum analyzing device, the signal processing device and/or the control processor may comprise, for example, a general purpose processor with corresponding instructions. Further, the spectrum analyzing device, the signal processing device and/or the control processor may comprise interfacing elements that are coupled to the processor, receive the respective signals and provide the received signals to the processor. The spectrum analyzing device, the signal processing device and/or the control processor may be realized by hardware elements. However, the devices may be also software-implemented at least in part. For this purpose, instructions may be stored in a memory that is coupled to a general purpose processor. The processor may execute an operating system that loads and executes the instructions. The processor may be, for example an Intel processor that runs a WINDOWS or Linux operating system that loads and executes the instructions. In another embodiment, the processor may run an embedded operating system that loads and executes the respective instructions. Furthermore, the spectrum analyzing device and the signal processing device may be realized, for example, by a Field Programmable Gate Array and/or an Application-specific Integrated Circuit.

To determine, whether or not the sampling rate of the signal processor is appropriate for the related signal, the control processor may determine whether or not at least one frequency component of the frequency spectrum which is determined by the spectrum analyzing device is outside a Nyquist band of the signal processing device, i.e. the respective frequency component is higher than the Nyquist frequency of the signal processing device. The Nyquist frequency and the Nyquist band of the signal processing device may depend on the sampling rate of the signal processing device. In particular, the Nyquist band may comprise a frequency range between zero and half of the sampling frequency which is the Nyquist frequency of the signal processing device. In case there exists a frequency component which is higher than half of the sampling frequency of the signal processing device, an aliasing effect may be expected. Accordingly, the control processor may provide an indication that the condition for the Nyquist frequency is violated. In this case, the sampling of the signal by the signal processing device may be not appropriate for a correct processing or reproduction of the signal. Such an indication may be provided to a user in order to indicate that the current measuring may be faulty, or the indication may be used in order to automatically adapt the set of the measurement apparatus. For example, a sampling rate of the signal processing device may be adapted accordingly.

By the present invention it is therefore possible to automatically identify measurement conditions which do not fulfill the Nyquist condition, and thus, aliasing effects may be expected. By providing an appropriate indication or automatically adapting the set of the measurement arrangement, the quality of the measurement can be improved.

Further embodiments of the present invention are subject of the further subclaims and the following descriptions referring to the drawings.

In a possible embodiment, the control processor is adapted to determine whether at least one frequency component of the determined frequency spectrum is higher than the Nyquist frequency of the signal processing device.

According to the Nyquist condition, a digitized signal can be reproduced correctly, if the sampling frequency is at least double of the frequency to be digitized. Thus, the Nyquist frequency is twice the sampling frequency of the signal processing device. Accordingly, by fulfilling this Nyquist condition, aliasing effects can be avoided. If the before mentioned Nyquist condition is violated, the control processor may generate an indication for informing a user of this violation. In this case, the user can adapt the settings such that the Nyquist condition is fulfilled and aliasing effects can be avoided. Alternatively, it may be also possible to adapt the setting automatically such that the Nyquist condition is fulfilled.

In a possible embodiment, the signal processing device is adapted to decimate the measurement signal.

By decimating the measurement signal, a sampling rate of a digitized signal with a first sampling rate may be converted to another signal having a second, lower sampling rate. In this way, the amount of data can be reduced. By monitoring the Nyquist condition and detecting aliasing effects when performing such a decimating of the measurement signal, it can be ensured that the decimating of the measurement signal is performed only such that no disturbances due to aliasing effects or the like are introduced.

In a possible embodiment, the control processor is adapted to compute a position of interferences in an output of the signal processing device. In particular, such interferences may be computed if at least one frequency component is higher the Nyquist frequency of the signal processing device.

If at least one frequency component is higher than the Nyquist frequency, disturbances such as aliasing effects may occur. Thus, the control device may compute the impact of the digitized signal when violating the Nyquist condition. For example, it may be possible (that one or more positions in the digitized signal which are influenced due to the violation of the Nyquist condition. In particular, it may be possible to identify the related positions in the signal and/or the impact of the interfered signal due to the violation of the Nyquist condition. By identifying the position and/or the impact of the interference, the interferences may be taken into account when evaluating the processed measurement signal.

In a possible embodiment, the control processor is adapted to output a recommendation for adapting at least one parameter of the measurement apparatus.

For example, a recommendation for adapting the measurement apparatus may comprise a recommendation for adapting, in particular increasing, the sampling rate of the signal processing device, or adapting a filter parameter. For example, by adapting a filter parameter it is possible to eliminate frequency components which might violate a Nyquist condition according to the preset sampling rate. Such a recommendation may be provided to a user. For example, the recommendation may be provided by a display.

In a possible embodiment, the control processor may be adapted to set the signal processing device based on the determined position of the at least one frequency component which is higher than the Nyquist frequency of the signal processing device.

For example, a sampling rate of the signal processing device may be automatically adapted based on the determined frequency components. In particular, a sampling rate may be increased, if it is detected that at least one frequency component is outside the Nyquist band according to the preset conditions. Additionally or alternatively, it may be also possible to adapt a frequency filter. For example, it may be possible to filter out frequency components in the measurement signal which do not fulfill the Nyquist condition according to the settings of the signal processing device.

However, it is understood that any other modification in the set of the signal processing device may be also applied in order to adapt the setting of the signal processing device to the detected frequency components.

In a possible embodiment, the input device may be adapted to provide the received measurement signal with an input sampling rate. The input sampling rate may be higher than the preset sampling rate of the signal processing device.

As already mentioned above, the input device may receive a digitized signal having an input sampling rate. Alternatively, it may be also possible to digitize an analog signal with a predetermined input sampling rate. The sampling rate of the digital measurement signal may be higher than the sampling rate of the signal processing device. By using a higher sampling rate, it may be possible to identify higher frequency components by the spectrum analyzing device.

In a possible embodiment, the measurement apparatus may comprise a first filter. The first filter may be adapted to apply a filtering, in particular a low pass filtering of the received measurement signal. The filtered signal may be provided to the spectrum analyzing device. Furthermore, the control processor may be adapted to set the filter characteristic of the first filter.

Depending on the signal provided by the input device, the first filter may be an analog filter or a digital filter. By filtering the signal provided by the input device and providing the filtered signal to the spectrum analyzing device, it is possible to eliminate frequencies or frequency bands. Accordingly, the signal may be adapted in order to avoid unwanted frequency components. By adapting the filter characteristics of the first filter according to the set of the signal processing device, it may be possible to eliminate frequencies which might violate the Nyquist condition and cause aliasing effects. Furthermore, by analyzing the filtered signal by means of the spectrum analyzing device, it is possible to verify the setting and the proper operation of the first filter. The filter characteristics of the first filter which may be set by the control processor may comprise an edge frequency or a frequency range or any other appropriate parameter for setting the first filter.

In a possible embodiment, the measurement apparatus may comprise a second filter. The second filter may be adapted to apply a filtering, in particular a low pass filtering of the received measurement signal. The filtered signal may be provided to the signal processing device. In this case, the control processor may be adapted to set the filter characteristics of the second filter. The control processor may further determine whether or not the frequency spectrum determined by the spectrum analyzing device may comprise at least one frequency component which is filtered out by the second filter.

In particular, the control processor may set the filter characteristics of the second filter such that the second filter only provides a signal which fulfills the Nyquist condition according to the sampling rate of the signal processing device. In this way, aliasing effects can be avoided in the signal processing device. In case the second filter may filter out at least one frequency component which has been identified in the signal analyzed by the spectrum analyzing device, the signal which has been processed by the signal processing device does not identically correspond to the measurement signal. In this case, an indication may be provided in order to indicate that the processed signal is not identical to the measurement signal.

Furthermore, it may be possible to set the filter characteristics of the second filter based on the frequency components identified by the spectrum analyzing device. For example, the frequency range, an edge frequency of the filter or any other filter characteristic may be adapted depending on the determined frequency components. However, it is understood that any other scheme for adapting the filter characteristics of the second filter may be also applied.

In a possible embodiment, the measurement apparatus, in particular the signal processing device may comprise an oscilloscope.

An oscilloscope may provide a visualization of a measurement signal. In particular, the visualized signal may be based on the signal processed by the signal processing device. Accordingly, the sampling rate may be adapted by the signal processing device such that the amount of data may be minimized and/or the accuracy of the visualized signal may be improved. Furthermore, a filtering for equalization etc., may be applied by the signal processing device. By monitoring the Nyquist condition when applying the processing of the signal processing device, it is possible to identify disturbances such as aliasing effects or the like. Thus, the setting of the measuring device, in particular of the oscilloscope can be improved by guiding a user through the setup or automatically performing the setting of the oscilloscope.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

Figure 1:
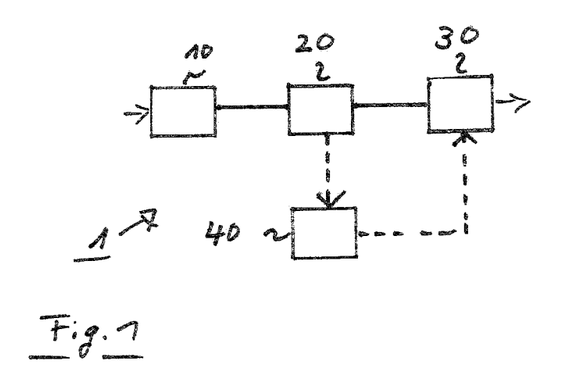
FIG. 1 shows a block diagram of an embodiment of a measurement apparatus according to the present invention.

FIG. 1 shows a block diagram of a measurement apparatus 1 according to an embodiment of the present invention. The measurement apparatus 1 comprises an input device 10, a spectrum analyzing device 20, a signal processing device 30 and a control processor 40. Input device 10 may receive a measurement signal. For example, the measurement signal may be received from a device under test. For example, input device 10 may comprise a connector for directly connecting a device under test or connecting a cable for electrically coupling the input device with the device under test. Alternatively, input device 10 may receive a wireless signal, for example by means of an antenna or an antenna system. However, it is understood that any other way for receiving a measurement signal may be also possible. The measurement signal may be received as an analog or a digital signal. If the measurement signal is received as a digital signal, the digital measurement signal may be provided with a high sampling rate such that it is possible to reconstruct and/or identify high frequency components in the measurement signal. Alternatively, it may be also possible to receive an analog measurement signal and to convert the received analog signal to a digital signal in the input device. For this purpose, the input device may comprise an analog-to-digital converter. In this case, the analog-to-digital converter may convert the analog signal to a digital signal with a high sampling rate, in particular a sampling rate such that high frequency components can be reconstructed and/or identified in the digital signal. Alternatively, it may be also possible that the input device receives an analog signal and provides an analog signal corresponding to the received signal. Input device 10 may comprise a further component such as an amplifier, an attenuator, a filter or any further components, for example for adapting an impedance of an input port of the input device 10. However, the input device is not limited to the before-mentioned components, and it is also possible that the input device may comprise any other kind of further elements.

Input device 10 is connected with spectrum analyzing device 20, and input device 10 may provide a signal corresponding to the received measurement signal to the spectrum analyzing device 20. Accordingly, spectrum analyzing device 20 may receive the signal provided by input device 10 and analyze the signal in order to determine a frequency spectrum of the signal provided by input device 10. For example, spectrum analyzing device 20 may perform a Fast Fourier Transform (FFT) or the like. However, any other kind of processing of the signal provided by input device 10 may be performed in order to identify frequency components in the provided signal for determining the frequency spectrum. For this purpose, spectrum analyzing device 20 may comprise a circuit with a Field Programmable Gate Array (FPGA) or the like. However, it is understood, that the analysis may be also performed by any other kind of circuit for computing frequency components of the signal provided by input device 10. In case the signal provided by input device 10 is an analog signal, it may be also possible that spectrum analyzing device 20 may comprise a number of filter banks, wherein each filter bank is related to a predetermined frequency or frequency band. Accordingly, by analyzing the output of each filter bank, it is possible to identify frequency components relating to the respective frequency or frequency band.

Spectrum analyzing device 20 may separately identify each frequency included in the signal provided by input device 10. Alternatively, it may be also possible to consider a number of frequency bands and to consider all frequencies included in a frequency band as a whole. It may be sufficient to provide information whether or not the signal provided by input device 10 comprises a frequency relating to a predetermined frequency or frequency band. However, it may be also possible to provide further information, e.g. regarding the magnitude of the frequency or frequencies, while detecting a frequency component.

Spectrum analyzing device 20 may perform a determination of the frequency spectrum based on a predetermined, fixed setting. Alternatively, it may be also possible that the determination of the frequency spectrum of the signal provided by input device 10 may be adapted. For example, control processor 40 may control the operation of spectrum analyzing device 20 in order to adapt the set. For example, the detection of the frequency components by spectrum analyzing device 20 may be adapted depending on the set of the signal processing device 30. For example, the determination of the frequency components by spectrum analyzing device 20 may be set depending on a sampling rate of signal processing device 30. For example, spectrum analyzing device 20 may be setup such that spectrum analyzing device 20 only detects frequency components which are higher than half of a sampling frequency used by signal processor device 30. However, any other scheme for setting spectrum analyzing device 20 may be also possible.

Signal processing device 30 may also receive the signal provided by input device 10, and perform a processing of the signal provided by input device 10. In particular, the processing of the signal is performed in a digital domain. In case input device 10 provides the signal as an analog signal, signal processing device 30 may perform an analog-to-digital conversion. The analog-to-digital conversion may be performed according to a preset sampling rate. Alternatively, signal processing device 30 may receive the signal provided by input device 10 as a digital signal. In this case, signal processing device 30 may change the sampling rate of the received digital signal. In particular, the sampling rate may be decreased. In this way, the amount of data which has to be processed can be reduced. Furthermore, any other scheme for decimating the amount of data may be also applied. Furthermore, any other kind of operation may be also applied to the signal provided by input device 10. For example, the signal may be amplified, attenuated, filtered, etc. Due to the decimation of the data, in particular due to a down-sampling, a frequency range of the signal which can be reconstructed without disturbances may be limited. In particular, aliasing effects may occur if the sampling rate of the signal is not high enough. For this purpose, control processor 40 may analyze the setting of signal processing device 30 and compare the settings with the frequency components determined by spectrum analyzing device 20. For example, control processor 40 may take into account a sampling rate or a sampling frequency which is a reciprocal value of the sampling rate used by signal processing device 30 and compare this sampling frequency with the frequency components of the frequency spectrum determined by spectrum analyzing device 20. According to the Nyquist condition, the sampling frequency applied by signal processing device 30 has to be at least twice the highest frequency of a signal which is sampled. Otherwise, disturbances such as aliasing effects may occur. Thus, control processor 40 may compute a Nyquist frequency or a Nyquist band (i.e. a frequency band between zero and twice the sampling frequency). Based on the determined Nyquist frequency or the Nyquist band, control processor 40 may determine whether or not spectrum analyzing device 20 has determined at least one frequency component which is higher than the Nyquist frequency, i.e. a frequency component outside the Nyquist band of the signal provided by input device 10.

In case signal processor 40 has determined, that at least one frequency component exists in the signal provided by input device 10, which is outside the Nyquist band, signal processor 40 may provide an output signal for indicating that the Nyquist condition is violated. For example, control processor 40 may provide an optical and/or acoustical signal. Such a signal may be provided to a user. Accordingly, a user can recognize that the Nyquist condition is violated and aliasing effects may exist in the results of signal processing device 30. In this case, a user may adapt the setting of measurement apparatus 1. For example, the sampling rate of signal processing device 30 may be increased. Furthermore, it may be also possible to filter the measurement signal in order to eliminate higher frequency components.

Alternatively, the signaling of control processor 40 for indicating that the Nyquist condition is violated may be also used to automatically adapt the setting of measurement apparatus 1. For example, control processor 40 may automatically adapt the set of signal processing device 30. For example, a sampling rate applied by signal processing device 30 may be increased such that the Nyquist condition is fulfilled. Furthermore, it may be also possible to apply a filtering of the signal such that the detected higher frequency components are eliminated or at least decreased. However, it is understood that any other further operation for setting up the measurement apparatus 1 may be also possible, to avoid aliasing effects.

If the Nyquist condition is violated, control processor 40 may generate a recommendation how to adapt the setting such that aliasing effects can be avoided. For example, a signaling may be provided, which may show to a user how to set the measurement apparatus 1 accordingly. For example, a control button may be highlighted, or a message may be output on a display. However, it is understood that any other kind of signaling may be also provided in order to output a recommendation for setting the measurement apparatus. The recommendation may be computed, for example by identifying the highest frequency components in the signal provided by input device 10, and computing the Nyquist frequency based on the highest frequency components. Accordingly, the recommendation may comprise how to set a sampling rate of the signal processing device such that the Nyquist condition is fulfilled. However, it is understood, that any other way for setting the measurement apparatus may be also possible.

Alternatively or additionally, control processor 40 may automatically adapt a setting of the measurement apparatus 1, in particular to set the signal processing device 30 based on the frequency components provided by spectrum analyzing device 20. The setting may be performed such that a Nyquist condition is fulfilled, taking into account the highest frequency components determined by spectrum analyzing device 20.

Figure 2:
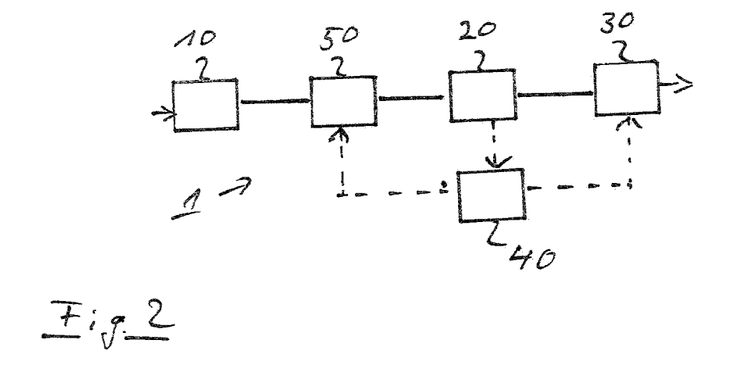
FIG. 2 shows a block diagram of a further embodiment of a measurement apparatus according to the present invention.

FIG. 2 shows a block diagram of a further embodiment of a measurement apparatus 1. The measurement apparatus 1 according to FIG. 2 mainly corresponds to the previously described measurement apparatus. Thus, the explanation of measurement apparatus 1 according to FIG. 1 also applies to the measurement apparatus 1 according to FIG. 2. The measurement apparatus 1 according to FIG. 2 further comprises a first filter 50. The first filter 50 is arranged in a signal path between the output of input device 10 and an input of spectrum analyzer 20. In case input device 10 provides an analog signal, first filter 50 may be an analog filter. Alternatively, if input device 10 provides a digital signal, first filter 50 may be a digital filter. First filter 50 may be a frequency filter, in particular a low pass filter or a band pass filter. Accordingly, the first filter 50 may filter out frequency components which may cause disturbances, for example aliasing effects when processing the filtered signal by signal processing device 30. For this purpose, the filter characteristics, in particular a filter frequency of the first filter 50 may be set by control processor 40 accordingly. In particular, the filter characteristics of the first filter 50 may be set based on the settings applied to signal processing device 40. For example, control processor 40 may take into account the frequency components identified by spectrum analyzing device 20. In case the frequency components identified by spectrum analyzing device 20 comprise at least one frequency which is outside a Nyquist band according to the current settings of the signal processing device 30, control processor 40 may set the filter parameters of the first filter 50 such that the respective frequency component is eliminated or at least decreased. Furthermore, it may be possible to provide an indication of the applied filtering. In this way, a user may recognize that at least one frequency component is filtered out in the signal, and thus, the signal processed by signal processing device 40 does not identically correspond to the measurement signal received by input device 10.

Figure 3:
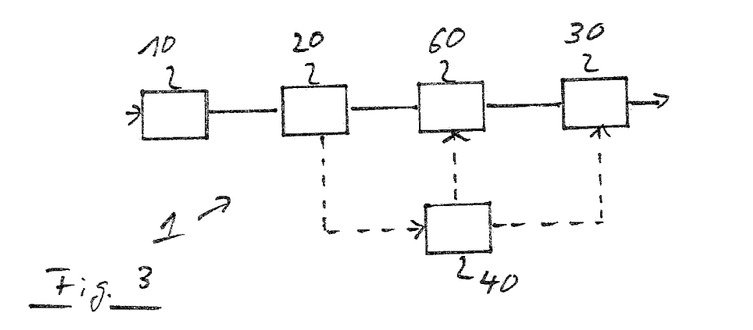
FIG. 3 shows a block diagram of another embodiment of a measurement apparatus according to the present invention.

FIG. 3 shows a block diagram of a further embodiment of a measurement apparatus 1. The measurement apparatus 1 according to FIG. 3 mainly corresponds to the previously described measurement apparatus 1. Thus, the explanation regarding to measurement apparatus 1 according to FIG. 1 or 2 also applies to the measurement apparatus 1 according to FIG. 3. Furthermore, the measurement apparatus 1 according to FIG. 1 or 2 may be combined with the features of the measurement apparatus according to FIG. 3.

The measurement apparatus 1 according to FIG. 3 further comprises a second filter 60. The second filter 60 may be arranged in a signal path between spectrum analyzing device 20 and signal processing device 30. Thus, spectrum analyzing device 20 receives the signal provided by input device 10 without a filtering by the second filter 60, whereas signal processing device 30 receives a signal which is filtered by the second filter 60.

The second filter 60 may be a frequency filter, in particular a low pass or a band pass filter. The filter parameter such as a filter frequency or the like may be set by control processor 40. For example, control processor 40 may analyze the frequency components provided by spectrum analyzing device 20 and compare the frequency components with the set, in particular the sampling rate, of signal processing device 40. If control processor 40 detects that the signal analyzed by spectrum analyzing device 20 comprises at least one frequency component which violates the Nyquist condition according to the settings of signal processing device 30, control processor 40 may set the second filter 60 such that the respective frequency component is filtered out. Thus, the frequency components which may cause disturbances such as aliasing effects in the signal provided by input device 10 may be eliminated or at least decreased by the second filter 60. Furthermore, a signaling may be provided for indicating that at least one frequency component is filtered by the second filter 60. Accordingly, it can be recognized that the signal processed by signal processing device 30 does not identically correspond to the measurement signal, in particular the signal provided by input device 10.

Furthermore, control processor 40 may analyze the frequency components detected by spectrum analyzing device 20 and compare the determined frequency components with the setting of signal processing device 30. In case at least one frequency component exists in the signal analyzed by spectrum analyzing device 20 which may violate the Nyquist condition, control processor 40 may compute an impact of the reduced sampling rate to the processed signal. For example, control processor 40 may compute interferences in a shape of the signal which might be reproduced based on the limited sampling. Especially, control processor 40 may identify positions in the signal curve which might be influenced due to the reduced sampling rate. Additionally or alternatively, it may be also possible to identify a change in the signal shape due to the respective interferences. Furthermore, any other characteristics influenced due to the reduced sampling may be identified. The identified interferences may be taken into account when further analyzing the result of the signal processing device 30. For example, the result of signal processing device 30 may be provided on a display. In this case, the identified interferences may be also indicated when displaying the result of signal processing device 30.

For example, the measurement apparatus 1 may be included in an oscilloscope for displaying signal curves of an acquired measurement signal. In this case, the output of signal processing device 30 may directly provided on a display or stored in a memory for a later reproduction on a display. In such a case, when the measurement apparatus 1 is included in an oscilloscope, signal processing device 30 may apply a filtering of the signal in order to perform equalization or the like. Furthermore, signal processing device 30 may apply a down-sampling or a decimation of the measurement signal in order to reduce the amount of data. However, any further processing may be also applied by signal processing device 30.

For sake of clarity in the following description of the method based FIG. 4 the reference signs used above in the description of apparatus based FIGS. 1-3 will be maintained.

Figure 4:
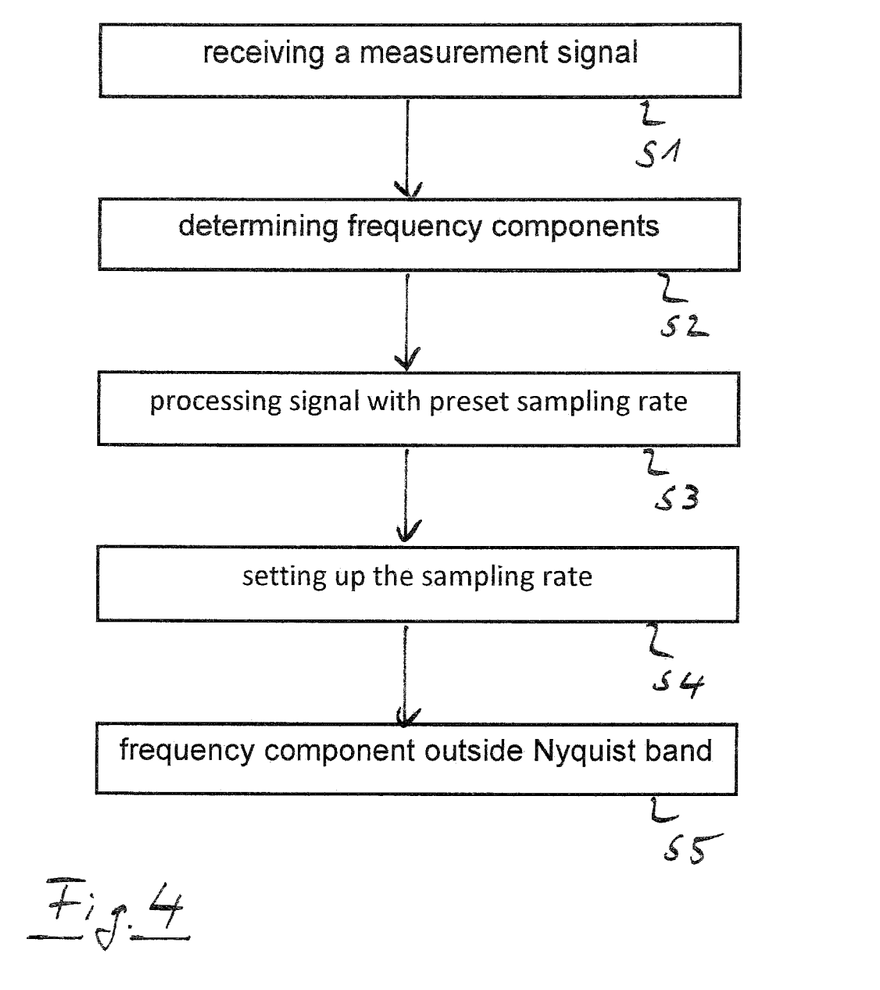
FIG. 4 shows a flow diagram of an embodiment of a measurement method according to the present invention.

FIG. 4 shows a flow chart of measurement method for digitally measuring a signal according to an embodiment. The method comprises a step S1 of receiving a measurement signal. The receiving S1 may be performed by the input device 10. The method further comprises a step S2 of determining a frequency spectrum of the received measurement signal. The determination S2 may be performed by the spectrum analyzing device 20. The method further comprises a step S3 of processing the received measurement signal with a preset sampling rate. The processing may be performed by a signal processing device 30. Finally, the method comprises a step S4 of setting the sampling rate, and a step S5 of determining a position of at least one frequency component of the frequency spectrum relative to a Nyquist frequency of the signal processing device. The steps S4 and S5 may be performed by a control processor.

The determining S5 may comprise determining whether at least one frequency component of the determined frequency spectrum is higher than the Nyquist frequency of the signal processing device, i.e. higher than half of the preset sampling rate of the signal processing device 30.

The processing S3 the received measurement signal may comprise decimating the measurement signal.

The method may comprise computing a position of an interference in an output of the signal processing device 30, if at least one frequency component of the determined frequency spectrum is higher than the Nyquist frequency of the signal processing device 30.

The method may comprise outputting a recommendation for adapting at least one parameter of the measurement apparatus.

The method may comprise setting the signal processing device 30 based on the determined at least one frequency component outside the Nyquist band of the signal processing device 30.

The receiving S1 the measurement signal may comprises providing the received measurement signal with an input sampling rate. The input sampling rate may be higher than the preset sampling rate of the signal processing device 30.

The method may comprise applying a low pass filtering of the received measurement signal by a first filter 50, and providing the filtered measurement signal to the spectrum analyzing device 20. The method may further comprise setting up the filter characteristic of the first filter 50 by the control processor 40.

The method may comprise applying a low pass filtering of the received measurement signal by a second filter 60, and adapting the filtered measurement signal to the signal processing device 30. The method may further comprise setting the filter characteristic of the second filter 60 by the control processor 40, and determining whether or not the frequency components of the determined frequency spectrum comprise at least one frequency component which is filtered out by the second filter 60.

The method may comprise outputting the processed measurement signal of the signal processing device by an oscilloscope.

Summarizing, the present invention relates to a processing of digitally measured signals. When sampling a measurement signal with a predetermined sampling rate, aliasing effects may occur, if a Nyquist condition is violated. For this purpose, the present invention suggests to analyze a frequency spectrum of a signal and to compare the frequency components in the spectrum with the setting of a measurement apparatus, in particular a sampling rate of the measurement apparatus. If a measurement signal comprises frequency components which may violate the Nyquist condition, an alert may be generated to adapt the set of the measurement arrangement.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A measurement apparatus for digitally measuring a signal, the apparatus comprising:
    an input device adapted to receive a measurement signal;
    a spectrum analyzing device adapted to determine a frequency spectrum of the received measurement signal;
    a signal processing device adapted to process the received measurement signal with a preset sampling rate;
    a control processor adapted to set the sampling rate of the signal processing device, and to determine a position of at least one frequency component of the frequency spectrum relative to a Nyquist frequency of the signal processing device; and
    a filter adapted to apply a low pass filtering of the received measurement signal and to provide the filtered measurement signal to the signal processing device,
    wherein the control processor is adapted to set the filter characteristic of the filter, and to determine whether or not the frequency components of the frequency spectrum determined by the spectrum analyzing device comprise at least one frequency component filtered out by the filter.

2. The apparatus according to claim 1, wherein the control processor is adapted to determine whether at least one frequency component of the determined frequency spectrum is higher than the Nyquist frequency of the signal processing device.

3. The apparatus according to claim 1, wherein the signal processing device is adapted to decimate the measurement signal.

4. The apparatus according to claim 1, wherein the control processor is adapted to compute a position of an interference in an output of the signal processing device, if at least one frequency component of the frequency spectrum is higher than the Nyquist frequency of the signal processing device.

5. The apparatus according to claim 1, wherein the control processor is adapted to output a recommendation for adapting at least one parameter of the measurement apparatus.

6. The apparatus according to claim 1, wherein the control processor is adapted to set the signal processing device based on the determined position of the at least one frequency component of the frequency spectrum.

7. The apparatus according to claim 1, wherein the input device is adapted to provide the received measurement signal with an input sampling rate, said input sampling rate being higher than the preset sampling rate of the signal processing device.

8. The apparatus according to claim 1, comprising a further filter adapted to apply a low pass filtering of the received measurement signal, and to provide the filtered measurement signal to the spectrum analyzing device,
    wherein the control processor is adapted to set the filter characteristic of the further filter.

9. The apparatus according to claim 1, wherein the signal processing device comprises an oscilloscope.

10. A measurement method for digitally measuring a signal, the method comprising:

receiving a measurement signal by an input device;
determining a frequency spectrum of the received measurement signal by a spectrum analyzing device;
processing the received measurement signal with a preset sampling rate by a signal processing device;
setting the sampling rate of the signal processing device by a control processor; and
determining, by the control processor, whether a position of at least one frequency component of the frequency spectrum relative to a Nyquist frequency of the signal processing device;
applying a low pass filtering of the received measurement signal by a filter, and adapting the filtered measurement signal to the signal processing device, and
setting the filter characteristic of the filter by the control processor, and determining whether or not the frequency components of the determined frequency spectrum comprise at least one frequency component which is filtered out by the filter.

11. The method according to claim 10, wherein determining step comprises determining whether at least one frequency component of the determined frequency spectrum is higher than the Nyquist frequency of the signal processing device.

12. The method according to claim 10, wherein the processing the received measurement signal comprises decimating the measurement signal.

13. The method according to claim 10, comprising computing a position of an interference in an output of the signal processing device, if at least one frequency component of the determined frequency spectrum is higher than the Nyquist frequency of the signal processing device.

14. The method according to claim 10, comprising outputting a recommendation for adapting at least one parameter of the measurement apparatus.

15. The method according to claim 10, comprising setting the signal processing device based on the determined position of the at least one frequency component of the frequency spectrum.

16. The method according to claim 10, wherein receiving the measurement signal comprises providing the received measurement signal with an input sampling rate, said input sampling rate being higher than the preset sampling rate of the signal processing device.

17. The method according to claim 10, comprising applying a low pass filtering of the received measurement signal by a further filter, and providing the filtered measurement signal to the spectrum analyzing device,
wherein the method further comprises setting the filter characteristic of the further filter by the control processor.

18. The method according to claim 10, comprising outputting the processed measurement signal of the signal processing device by an oscilloscope.

* * * * *